United States Patent
Ogino et al.

(10) Patent No.: US 9,605,339 B2
(45) Date of Patent: *Mar. 28, 2017

(54) SPUTTERING TARGET FOR MAGNETIC RECORDING FILM AND PROCESS FOR PRODUCTION THEREOF

(75) Inventors: Shin-ichi Ogino, Ibaraki (JP); Atsushi Nara, Ibaraki (JP); Hideo Takami, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 869 days.

This patent is subject to a terminal disclaimer.

(21) Appl. No.: 13/990,109

(22) PCT Filed: Oct. 19, 2011

(86) PCT No.: PCT/JP2011/073993
§ 371 (c)(1),
(2), (4) Date: May 29, 2013

(87) PCT Pub. No.: WO2012/086300
PCT Pub. Date: Jun. 28, 2012

(65) Prior Publication Data
US 2013/0248362 A1    Sep. 26, 2013

(30) Foreign Application Priority Data
Dec. 21, 2010  (JP) ................................ 2010-284671

(51) Int. Cl.
C23C 14/34    (2006.01)
C22C 5/04    (2006.01)
(Continued)

(52) U.S. Cl.
CPC ............ C23C 14/3414 (2013.01); C22C 5/04 (2013.01); C22C 19/07 (2013.01);
(Continued)

(58) Field of Classification Search
CPC . C22C 2202/02; C22C 19/07; C22C 32/0026; C22C 33/0292; C22C 5/04;
(Continued)

(56) References Cited

U.S. PATENT DOCUMENTS 7,645,363 B2    1/2010  Ichihara et al.
7,927,434 B2    4/2011  Nakamura et al.
(Continued)

FOREIGN PATENT DOCUMENTS

JP    10-088333 A    4/1998
JP    10-158097 A    6/1998
(Continued)

Primary Examiner — Rodney McDonald
(74) Attorney, Agent, or Firm — Howson & Howson, LLP (57) ABSTRACT

A sputtering target for a magnetic recording film containing $SiO_2$, wherein a peak strength ratio of a (011) plane of quartz relative to a background strength (i.e. quartz peak strength/background strength) in an X-ray diffraction is 1.40 or more. An object of this invention is to obtain a sputtering target for a magnetic recording film capable of inhibiting the formation of cristobalites in the target which cause the generation of particles during sputtering, shortening the burn-in time, magnetically and finely separating the single-domain particles after deposition, and improving the recording density.

20 Claims, 1 Drawing Sheet (51) Int. Cl.
*C22C 19/07* (2006.01)
*G11B 5/851* (2006.01)
*H01F 41/18* (2006.01)
*C22C 32/00* (2006.01)
*C22C 33/02* (2006.01)
*B22F 3/14* (2006.01)

(52) U.S. Cl.
CPC ...... *C22C 32/0026* (2013.01); *C22C 33/0292* (2013.01); *G11B 5/851* (2013.01); *H01F 41/183* (2013.01); *B22F 3/14* (2013.01); *C22C 2202/02* (2013.01)

(58) Field of Classification Search
CPC ....... C23C 14/3414; C23C 14/34; B22F 3/14; G11B 5/851; H01F 41/183
USPC ..................................... 204/298.13; 264/122
See application file for complete search history.

(56) References Cited

U.S. PATENT DOCUMENTS

| | | | |
|---|---|---|---|
| 7,998,324 | B2 | 8/2011 | Watanabe et al. |
| 2007/0209547 | A1 | 9/2007 | Irumata et al. |
| 2009/0242393 | A1 | 10/2009 | Satoh |
| 2010/0089622 | A1 | 4/2010 | Irumata et al. |
| 2010/0320084 | A1 | 12/2010 | Sato |
| 2011/0247930 | A1 | 10/2011 | Sato |
| 2011/0284373 | A1 | 11/2011 | Sato et al. |
| 2012/0118734 | A1 | 5/2012 | Sato et al. |
| 2012/0241316 | A1 | 9/2012 | Arakawa |
| 2013/0098760 | A1* | 4/2013 | Takami .............. C23C 14/0688 204/298.13 |
| 2013/0175167 | A1 | 7/2013 | Ikeda et al. |
| 2013/0206591 | A1 | 8/2013 | Takami et al. |
| 2013/0292245 | A1 | 11/2013 | Ikeda et al. |
| 2015/0060268 | A1 | 3/2015 | Ogino |
| 2015/0107991 | A1 | 4/2015 | Sato |
| 2015/0170890 | A1 | 6/2015 | Ikeda |
| 2015/0213822 | A1* | 7/2015 | Ogino ..................... G11B 5/65 75/233 |

FOREIGN PATENT DOCUMENTS

| | | |
|---|---|---|
| JP | 2000-178726 A | 6/2000 |
| JP | 2001-064766 A | 3/2001 |
| JP | 2002-309366 A | 10/2002 |
| JP | 2004-339586 A | 12/2004 |
| JP | 2005-097657 A | 4/2005 |
| JP | 2006-045587 A | 2/2006 |
| JP | 2006-176808 A | 7/2006 |
| JP | 2007-031808 A | 2/2007 |
| JP | 2008-162849 A | 7/2008 |
| JP | 2008-179900 A | 8/2008 |
| JP | 2009-001861 A | 1/2009 |
| JP | 2009-080348 A | 4/2009 |
| TW | 379256 B | 1/2000 |

* cited by examiner

SPUTTERING TARGET FOR MAGNETIC RECORDING FILM AND PROCESS FOR PRODUCTION THEREOF

BACKGROUND

The present invention relates to a sputtering target for a magnetic recording film for use in the deposition of a magnetic thin film of a magnetic recording medium, and particularly of a magnetic recording layer of a hard disk adopting the perpendicular magnetic recording system, and to a sputtering target capable of inhibiting the formation of cristobalites that cause the generation of particles during sputtering, and shortening the time required from the start of sputtering to deposition and the time is hereinafter referred to as the "burn-in time".

In the field of magnetic recording as represented with hard disk drives, a material based on Co, Fe or Ni as ferromagnetic metals is used as the material of the magnetic thin film which is used for the recording. For example, Co—Cr-based or Co—Cr—Pt-based ferromagnetic alloys with Co as its main component are used for the recording layer of hard disks adopting the longitudinal magnetic recording system.

Moreover, composite materials of Co—Cr—Pt-based ferromagnetic alloys with Co as its main component and nonmagnetic inorganic matter are often used for the recording layer of hard disks adopting the perpendicular magnetic recording system which was recently put into practical application.

A magnetic thin film of a magnetic recording medium such as a hard disk is often produced by sputtering a ferromagnetic material sputtering target having the foregoing materials as its components in light of its high productivity. Moreover, $SiO_2$ is sometimes added to this kind of sputtering target for a magnetic recording film as a spacer for magnetically separating the alloy phase in the sputtered film.

As a method of manufacturing a ferromagnetic material sputtering target, the melting method or powder metallurgy may be considered. It is not necessarily appropriate to suggest which method is better since it will depend on the demanded characteristics, but a sputtering target made of ferromagnetic alloys and nonmagnetic inorganic particles used for the recording layer of hard disks adopting the perpendicular magnetic recording system is generally manufactured with powder metallurgy. This is because the inorganic particles of $SiO_2$ or the like need to be uniformly dispersed within the alloy substrate, and this is difficult to achieve with the melting method.

For example, proposed is a method of performing mechanical alloying to an alloy powder having an alloy phase prepared by the rapid solidification method and a powder configuring the ceramic phase, causing the powder configuring the ceramic phase to be uniformly dispersed in the alloy powder, and performing hot press thereto in order to obtain a sputtering target for use in a magnetic recording medium (Patent Document 1).

The target structure in the foregoing case appears to be such that the base metal is bonded in a milt (cod fish sperm) shape and surrounded with $SiO_2$ (ceramic) (FIG. 2 of Patent Document 1) or dispersed in a thin string shape (FIG. 3 of Patent Document 1). While it is blurred in the other diagrams, the target structure in such other diagrams is also assumed to be of the same structure. This kind of structure entails the problems described later, and it cannot be said that this kind of structure is a preferred sputtering target for a magnetic recording medium. Note that the spherical substance shown in FIG. 4 of Patent Document 1 is mechanical alloying powder, and is not a structure of the target.

Moreover, without having to use the alloy powder prepared by the rapid solidification method, it is also possible to produce a ferromagnetic material sputtering target by preparing commercially available raw material powders for the respective components configuring the target, weighing these raw material powders to achieve the intended composition, mixing the raw material powders with a known method such as a ball mill or the like, and molding and sintering the mixed powder via hot press.

There are various types of sputtering devices, but a magnetron sputtering device comprising a DC power source is broadly used in light of its high productivity for the deposition of the foregoing magnetic recording film. This sputtering method causes a positive electrode substrate and a negative electrode target to face each other, and generates an electric field by applying high voltage between the substrate and the target under an inert gas atmosphere.

Here, the sputtering method employs a fundamental principle where inert gas is ionized, plasma composed of electrons and positive ions is formed, and the positive ions in the plasma collide with the target (negative electrode) surface so as to sputter the atoms configuring the target. The discharged atoms adhere to the opposing substrate surface, wherein the film is formed. As a result of performing the sequential process described above, the material configuring the target is deposited on the substrate.

As described above, $SiO_2$ is sometimes added to this kind of sputtering target for a magnetic recording film as a spacer for magnetically separating the alloy phase in the sputtered film. When $SiO_2$ is added to the magnetic metal material, there is a problem in that micro cracks are generated in the target and the generation of particles during sputtering increases. Moreover, with a $SiO_2$-doped magnetic material target, there is an additional drawback in that the burn-in time becomes longer compared to a magnetic material target that is not doped with $SiO_2$.

While there was some debate as to whether this was due to problems related to the $SiO_2$ itself, because the $SiO_2$ had transformed, or problems related to the interaction with other magnetic metals or additive materials, the fundamental cause had not been determined. In most cases, the foregoing problems were considered inevitable and were quietly condoned or overlooked. However, it is necessary to maintain the characteristics of magnetic films at a high level based on current demands, and the further improvement of sputtered film characterizes is being demanded.

With conventional technologies, certain documents describe the technique of adding $SiO_2$ to a sputtering target using a magnetic material. Patent Document 2 discloses a target including a metal phase as a matrix phase, a ceramic phase that is dispersed in the matrix phase, and an interfacial reaction phase of the metal phase and the ceramic phase, wherein the relative density is 99% or more. While $SiO_2$ is included as an option as the ceramic phase, Patent Document 2 has no recognition of the foregoing problems and fails to propose any solution to such problems.

Upon producing a CoCrPt—$SiO_2$ sputtering target, Patent Document 3 proposes calcining Pt powder and $SiO_2$ powder, mixing Cr powder and Co powder to the obtained calcined powder, and performing pressure sintering thereof. Nevertheless, Patent Document 3 has no recognition of the foregoing problems and fails to propose any solution to such problems.

Patent Document 4 discloses a sputtering target including a metal phase containing Co, a ceramic phase having a grain size of 10 μm or less, and an interfacial reaction phase of the metal phase and the ceramic phase, wherein the ceramic phase is scattered in the metal phase, and proposes that $SiO_2$ is included as an option as the ceramic phase. Nevertheless, Patent Document 4 has no recognition of the foregoing problems and fails to propose any solution to such problems.

Patent Document 5 proposes a sputtering target containing non-magnetic oxide in an amount of 0.5 to 15 mol %, Cr in an amount of 4 to 20 mol %, Pt in an amount of 5 to 25 mol %, B in an amount of 0.5 to 8 mol %, and remainder being Co. While $SiO_2$ is included as an option as the non-magnetic oxide, Patent Document 5 has no recognition of the foregoing problems and fails to propose any solution to such problems.

Note that Patent Document 6 is also listed as a reference, but this document discloses technology of producing cristobalite particles as filler of sealants for semiconductor elements such as memories. While Patent Document 6 is technology that is unrelated to a sputtering target, it relates to $SiO_2$ cristobalites.

Patent Document 7 relates to a carrier core material for use as a electrophotographic developer. While Patent Document 7 is technology that is unrelated to a sputtering target, it relates to the types of crystals related to $SiO_2$. One type is $SiO_2$ quartz crystals, and the other type is cristobalite crystals.

While Patent Document 8 is technology that is unrelated to a sputtering target, it explains that cristobalite is a material that impairs the oxidation protection function of silicon carbide.

Patent Document 9 describes a sputtering target for forming an optical recording medium protection film having a structure where patternless $SiO_2$ is dispersed in the zinc chalcogenide base metal. Here, the transverse rupture strength of the target made of zinc chalcogenide-$SiO_2$ and the generation of cracks during of such target are affected by the form and shape of $SiO_2$, and Patent Document 9 discloses that when the $SiO_2$ is patternless (amorphous), the target will not crack during sputtering, even with high-power sputtering.

While this is a suggestion in some ways, Patent Document 9 first and foremost relates to a sputtering target for forming an optical recording medium protection film using zinc chalcogenide, and it is totally unknown as to whether it can resolve the problems of a magnetic material having a different matrix material.

Moreover, Patent Document 10 describes a sputtering target for use in forming an optical recording protective film with low generation of particles. In the foregoing case, described is a target in which silicon dioxide powder is dispersed in a zinc sulfide base metal, and it is described that, as the silicon dioxide powder, used is crystalline silicon dioxide powder of quartz, cristobalite, tridymite, or the like.

Patent Document 10 indicates each of the silicon dioxide powders illustrated above in an equal manner, and fails to consider the advantages and disadvantages of the respective powders.

Patent Document 11 describes a sputtering target for a magnetic recording film with low generation of particles. In addition, paragraph [0008] describes as follows: "As the silica powder as the raw material powder, crystalline silica powder is more preferably used than amorphous silica powder. The reason for this is because crystalline silica powder is less likely to become flocculated and generate coarse particles than amorphous silica powder and, therefore, abnormal discharge is less likely to occur, and the generation of particles is low."

In the foregoing case, the reason why crystalline silica powder is more favorable is because the flocculation property is small and coarse particles are not generated easily, but there is no other description. To begin with, the main objective of the invention of Patent Document 11 is to uniformly disperse chromium oxide at the ground boundary, and no other reference is made to silica powder.

Generally speaking, there are several types of crystalline silica powder, but there is no disclosure of specific powder raw materials.

Patent Document 12 describes a sputtering target for use in forming a magnetic recording film, and its production method. In its conventional examples and comparative examples, Patent Document 12 describes as follows: "silica pulverized powder made from commercially available synthesized quartz is used". With the invention of Patent Document 12, the silica phase in the target has an average width, which was obtained via linear analysis, within a range of 0.5 to 5 μm, and Patent Document 12 fails to disclose the role of the quartz powder in a sputtering target, and the kind of quartz powder to be selected as the optimal quartz powder.

To begin with, since the quartz used in the comparative example of Patent Document 12 is synthesized quartz, it is not surprising that Patent Document 12 fails to specifically disclose the role of the quartz powder.

PRIOR ART DOCUMENTS

[Patent Document 1] JP-A-H10-88333
[Patent Document 2] JP-A-2006-45587
[Patent Document 3] JP-A-2006-176808
[Patent Document 4] JP-A-2008-179900
[Patent Document 5] JP-A-2009-1861
[Patent Document 6] JP-A-2008-162849
[Patent Document 7] JP-A-2009-80348
[Patent Document 8] JP-A-H10-158097
[Patent Document 9] JP-A-2000-178726
[Patent Document 10] JP-A-2001-64766
[Patent Document 11] JP-B-4553136
[Patent Document 12] JP-A-2004-339586

SUMMARY OF THE INVENTION

Technical Problem

A compound material made of ferromagnetic alloy and non-magnetic inorganic substance is often used in a sputtering target for a magnetic recording film, and $SiO_2$ is sometimes added as the inorganic substance. Nevertheless, with a target to which $SiO_2$ is added, there is a problem in that numerous particles are generated during the sputtering process, and a longer burn-in time is required.

Moreover, when $SiO_2$ is added to a magnetic metal material, micro cracks occur in the target, and there is a problem in that large amounts of particles are generated during sputtering.

Thus, the present inventors devised the method of adding $SiO_2$ to the sputtering target for a magnetic recording film, and discovered that it is possible to inhibit micro cracks in the target and the generation of particles during sputtering, as well as shorten the burn-in time, by inhibiting the formation of cristobalites that cause the generation of particles during sputtering, and previously filed a patent application (Japanese Patent Application No. 2010-171038).

While the foregoing invention was extremely effective for obtaining the foregoing characteristics compared to conventional technology, it is necessary to lower the sintering temperature to 1120° C. or lower in order to inhibit the formation of cristobalites, and, as a result of lowering the sintering temperature, it was discovered that there is a problem of the target density deteriorating. From the perspective of improving the density, the present inventors need to further improve the foregoing invention.

Solution to the Problems

In order to achieve the foregoing object, as a result of further intense study, the present inventors discovered that, by using a quarts as the raw material of $SiO_2$, it is possible to obtain a sputtering target capable of preventing the formation of cristobalites that cause the generation of particles during sputtering, inhibiting micro cracks of the target and the generation of particles during sputtering, shortening the burn-in time, and additionally improving the recording density.

Based on the foregoing discovery, the present invention provides:
1) A sputtering target for a magnetic recording film containing $SiO_2$, wherein a peak strength ratio of a (011) plane of quartz relative to a background strength (i.e. quartz peak strength/background strength) in an X-ray diffraction is 1.40 or more.

The present invention additionally provides:
2) The sputtering target for a magnetic recording film according to 1) above, wherein the sputtering target for a magnetic recording film contains Cr in an amount of 20 mol % or less (excluding 0 mol %), $SiO_2$ in an amount of 1 mol % or more and 20 mol % or less, and remainder being Co;
3) The sputtering target for a magnetic recording film according to 1) above, wherein the sputtering target for a magnetic recording film contains Cr in an amount of 20 mol % or less (excluding 0 mol %), Pt in an amount of 1 mol % or more and 30 mol % or less, $SiO_2$ in an amount of 1 mol % or more and 20 mol % or less, and remainder being Co;
4) The sputtering target for a magnetic recording film according to 1) above, wherein the sputtering target for a magnetic recording film contains Pt in an amount of 5 mol % or more and 60 mol % or less, $SiO_2$ in an amount of 20 mol % or less, and remainder being Fe; and
5) The sputtering target for a magnetic recording film according to 1) above, wherein the sputtering target for a magnetic recording film contains Pt in an amount of 5 mol % or more and 60 mol % or less, $SiO_2$ in an amount of 20 mol % or less, and remainder being Co.

The present invention further provides:
6) The sputtering target for a magnetic recording film according to any one of 1) to 5) above, additionally containing, as an additive element, one or more elements selected from B, Ti, V, Mn, Zr, Nb, Ru, Mo, Ta, and W in an amount of 0.5 mol % or more and 10 mol % or less;
7) The sputtering target for a magnetic recording film according to any one of 1) to 6) above, additionally containing, as an additive material, an inorganic material of one or more components selected from carbon, oxide excluding $SiO_2$, nitride, and carbide; and
8) A method of producing the sputtering target for a magnetic recording film according to any one of 1) to 7) above, wherein quartz is used as a powder raw material of $SiO_2$, the quartz powder raw material and magnetic metal powder raw material are mixed, and sintered at a sintering temperature of 1300° C. or less.

Effect of the Invention

The sputtering target for a magnetic recording film target of the present invention adjusted as described above yields superior effects of being able to prevent the formation of cristobalites without lowering the sintering temperature as a result of using quartz, inhibit the generation of micro cracks in a target, inhibit the generation of particles during sputtering, and shorten the burn-in time. Since few particles are generated, a significant effect is yielded in that the percent defective of the magnetic recording film is reduced and cost reduction can be realized. Moreover, shortening of the burn-in time contributes significantly to the improvement of production efficiency.

In addition, since the density of quartz is higher than the density of amorphous $SiO_2$ or cristobalite, the amount of substance of $SiO_2$ per unit volume can be increased by using quartz; that is, by increasing the amount of substance of oxide (i.e. quartz) in the target, it is possible to yield a significant effect of being able to magnetically and finely separate the single-domain particles after deposition, and improve recording density.

DETAILED DESCRIPTION OF THE INVENTION

The sputtering target for a magnetic recording film is a sputtering target for a magnetic recording film containing $SiO_2$, and uses quartz as the $SiO_2$. It is thereby possible to obtain a sputtering target for a magnetic recording film in which a peak strength ratio of a (011) plane of quartz relative to a background strength (i.e. quartz peak strength/background strength) in an X-ray diffraction is 1.40 or more.

Cristobalite, which is crystallized $SiO_2$, will not exist, or can be considerably reduced. Note that the quartz peak strength is 26.64°, and the calculation method of the background strength is (((average of 25.1° to 26.1°)+(average of 27.1° to 28.1°))°/2).

A compound material made of ferromagnetic alloy and non-magnetic inorganic substance is often used in a sputtering target for a magnetic recording film, and $SiO_2$ is sometimes added as the inorganic substance.

Nevertheless, when the $SiO_2$ crystallizes in the target and exists as cristobalites, a sudden volume change will occur simultaneously with the foregoing phase transition, since the cristobalites have a phase transition point between a phase and β phase near 270° C.

When the sintered compact is cooled after the sintering process, or when processing the sintered compact, micro cracks will arise due to the volume change since the sintered compact will pass near 270° C. These micro cracks are considered to be the cause of particles during sputtering.

Meanwhile, since quartz is not subject to a sudden volume change as with cristobalites (since quartz has no phase transition point), micro cracks will hardly occur. Hence, it is possible to reduce the generation of particles during sputtering.

In addition, the density of quartz is higher than the density of amorphous $SiO_2$ and cristobalites as described above, which enables to inject $SiO_2$ in a greater amount of substance in the same volume. This is effective for magnetically separating the single-domain crystals after deposition.

In other words, when $SiO_2$ is sputtered, most of the $SiO_2$ is once broken down into Si and O, and thereafter re-formed on the substrate. Here, the crystal structure after the reformation becomes amorphous without depending on the original crystal structure. Accordingly, high density quartz can discharge more Si and O with the same volume compared to amorphous $SiO_2$ and cristobalites, and quartz is more advantageous in terms of the recording density of $SiO_2$ after deposition.

Thus, as a result of using quartz which causes the generation of crystallized cristobalite to be difficult, it is possible to increase the sintering temperature, and thereby improve the target density. Also, this is effective to improve the recording density since a greater amount of substance of $SiO_2$ per unit volume can exist in the target.

When referring to quartz as the sputtering target raw material, while it is known that quartz can be used as the material of $SiO_2$, it could be said that there was no reason to use quartz powder unless there was some kind of special reason since amorphous $SiO_2$ powder is a material that can be easily obtained as fine powder.

Nevertheless, as a result of using quartz powder, it is possible to increase the sintering temperature and, consequently, improve the sintering density. By way of reference, the density of amorphous $SiO_2$ is 2.2 $g/cm^3$, the density of cristobalite is 2.33 $g/cm^3$, and the density of quartz is 2.65 $g/cm^3$, and the quartz itself is of high density. In order to increase the abundance ratio of quartz means to reduce the abundance ratio of amorphous $SiO_2$ and cristobalites. Moreover, since cristobalites will not be generated easily when quartz is sintered at a high temperature compared to amorphous $SiO_2$, the use of quartz is effective for improving the density of the sintered compact (target).

As described above, while there is no particular limitation in the magnetic material as the sputtering target for a magnetic recording film, preferably used is: (A) a sputtering target for a magnetic recording film containing Cr in an amount of 20 mol % or less (excluding 0 mol %), $SiO_2$ in an amount of 1 mol % or more and 20 mol % or less, and remainder being Co, (B) a sputtering target for a magnetic recording film containing Cr in an amount of 20 mol % or less (excluding 0 mol %), Pt in an amount of 1 mol % or more and 30 mol % or less, $SiO_2$ in an amount of 1 mol % or more and 20 mol % or less, and remainder being Co, (C) a sputtering target for a magnetic recording film containing Pt in an amount of 5 mol % or more and 60 mol % or less, $SiO_2$ in an amount of 20 mol % or less, and remainder being Fe, or (D) a sputtering target for a magnetic recording film containing Pt in an amount of 5 mol % or more and 60 mol % or less, $SiO_2$ in an amount of 20 mol % or less, and remainder being Co.

Note that the foregoing indication of "excluding 0 mol %" means that the effect can be yielded even with the addition of trace amounts of that element; and 0 is excluded so as long as the addition of that element is the object. Meanwhile, in the case of the Pt—Co—$SiO_2$-based target, it means that the existence of Cr is not required.

These are components which are required as the magnetic recording medium, and, although the blending ratio may be variously changed within the foregoing range, they are able to maintain characteristics as an effective magnetic recording medium.

In the foregoing cases also, the $SiO_2$ needs to exist as quartz in the target without becoming crystallized and existing as cristobalites.

Note that, in (A) above, Cr is added as an essential component, and the amount excludes 0 mol %. In other words, the amount of Cr to be included needs to be at least an analyzable lower limit or higher. If the Cr amount is 20 mol % or less, an effect can be yielded even in cases where trace amounts are added. The present invention covers all of the foregoing aspects. These elements are components that are required as a magnetic recording medium, and while the blending ratio may vary within the foregoing range, all of these components are able to maintain the characteristics as an effective magnetic recording medium.

Note that, in (B) above, Cr is added in an amount of 20 mol % or less, but the amount excludes 0 mol %. Moreover, when Pt is added in an amount of 1 mol % or more and 30 mol % or less, an effect is yielded even in cases of adding trace amounts of that element. The present invention covers all of the foregoing aspects. These elements are components that are required as a magnetic recording medium, and, while the blending ratio may be variously changed within the foregoing range, all blending ratios are able to maintain the characteristics as an effective magnetic recording medium.

In addition, (C) above is a sputtering target for a magnetic recording film having Fe—Pt alloy as its main component, and this sputtering target also exhibits similar effects.

Also effective is the foregoing sputtering target for a magnetic recording film containing, as an additive element, one or more elements selected from B, Ti, V, Mn, Zr, Nb, Ru, Mo, Ta, and W in an amount of 0.5 mol % or more and 10 mol % or less. The additive element is an element that is added as needed in order to improve the characteristics as a magnetic recording medium.

Further, also effective is the foregoing sputtering target for a magnetic recording film containing, as an additive element, an inorganic material of one or more components selected from carbon, oxide excluding $SiO_2$, nitride, and carbide.

Upon producing this kind of sputtering target for a magnetic recording film, it is effective to use quartz as the powder raw material of $SiO_2$. The quartz powder raw material and magnetic metal powder raw material are mixed, and sintered at a sintering temperature of 1300° C. or less. This high sintering temperature is enabled by the use of high density quartz, and this is effective in improving the target density.

While a specific example of the production method is now explained, this production method is merely a representative and preferred example. In other words, the present invention is not limited to the following production method, and it should be easy to understand that other production methods may also be adopted so as long as they are able to achieve the object and conditions of the present invention.

The ferromagnetic material sputtering target of the present invention can be manufactured with powder metallurgy. Foremost, powders of the respective metal elements, quartz powder, and powders of the additive metal elements are prepared as needed. Desirably, the maximum particle size of these powders is 20 μm or less.

Moreover, the alloy powders of these metals may also be prepared in substitute for the powders of the respective metal elements, and, desirably, the maximum particle size is also 20 μm or less in the foregoing case.

Meanwhile, if the particle size is too small, there is a problem in that oxidation is promoted and the component composition will not fall within the intended range. Thus, desirably, the particle size is 0.1 μm or more.

Then, these raw material powders are weighed to obtain the intended composition, mixed and pulverized with well-known methods by using a ball mill or the like. Inorganic powder should be added to the metal powders at this stage if needed.

Carbon powder, oxide powder other than $SiO_2$, nitride powder or carbide powder is prepared as the inorganic powder, and, desirably, the maximum particle size of the inorganic powder is 5 μm or less. Meanwhile, if the particle size is too small, the powders become clumped together, and the particle size is therefore desirably 0.1 μm or more.

As the mixer, a planetary mixer or a planetary agitator/mixer is preferably used. In addition, mixing is preferably performed in an inert gas atmosphere or a vacuum in consideration of the problem of oxidation in the mixing process.

By molding and sintering the powder obtained as described above using a vacuum hot press device, and cutting it into an intended shape, it is possible to produce the ferromagnetic material sputtering target of the present invention. Here, as described above, sintering is performed at a sintering temperature of 1300° C. or less. This high sintering temperature is a temperature that is required for inhibiting the deterioration of the sintering density.

Moreover, the molding and sintering processes are not limited to the hot press method, and a plasma discharge sintering method or a hot isostatic sintering method may also be used. The holding temperature during the sintering process is preferably set to the lowest temperature within the temperature range in which the target can be sufficiently densified. Although this will depend on the composition of the target, in many cases a temperature range of 1100 to 1300° C. is preferable.

EXAMPLES

The present invention is now explained in detail with reference to the Examples and Comparative Examples. Note that these Examples are merely illustrative and the present invention shall in no way be limited thereby. In other words, various modifications and other embodiments are covered by the present invention, and the present invention is limited only by the scope of its claims.

Example 1

In Example 1, as the raw material powders, Co powder having an average grain size of 3 μm, Cr powder having an average grain size of 5 μm, and quartz powder ($SiO_2$ powder) having an average grain size of 1 μm were prepared. These powders were weighed at the weight percentage of Co powder 81.42 wt %, Cr powder 10.72 wt %, and $SiO_2$ powder 7.84 wt % to achieve a target composition of 80.4 Co-12 Cr-7.6 $SiO_2$ (mol %).

Subsequently, the Co powder, Cr powder and quartz ($SiO_2$) powder were placed in a ball mill pot with a capacity of 10 liters together with zirconia balls as the grinding medium, and rotated and mixed for 20 hours.

Figure 1:
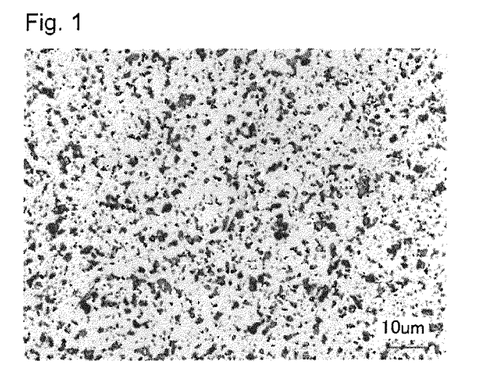
FIG. 1 is a structure photo of the target of Example 1 which uses quartz.

This mixed powder was filled in a carbon mold, and hot pressed in a vacuum atmosphere under the conditions of temperature of 1160° C., holding time of 120 minutes, and pressure of 30 MPa to obtain a sintered compact. This was further processed with a lathe to obtain a disk-shaped target having a diameter of 180 mm and thickness of 5 mm. The structure photo of this target is shown in FIG. 1.

The peak strength of quartz was measured by cutting out a part of the target and performing measurement based on the X-ray diffraction method. The results are shown in Table 1.

The peak strength appearing at 2θ:26.64° was 404, and the background strength (((average value of strength of 25.1 to 26.1°)+(average value of strength of 27.1 to) 28.1°)+2) was also measured.

The peak strength ratio of the quartz of the (011) plane relative to the background strength, i.e. quartz peak strength/background strength, was 10.98. Note that the measuring device was Ultima IV manufactured by Rigaku, and the measuring conditions were as follows: tube voltage of 40 kv, tube current of 30 mA, scan speed of 4°/min, and step of 0.02°.

TABLE 1

|  | Composition | Composition Ratio (mol %) | Composition Ratio (wt %) | Hot Press Temperature (° C.) | 26.64° Strength | Quartz (011) Strength Ratio | Burn-in (kWh) | Particle Count |
|---|---|---|---|---|---|---|---|---|
| Example 1 | Co—Cr—$SiO_2$ | 80.4-12-7.6 | 81.42-10.72-7.84 | 1160 | 404 | 10.98 | 0.25 | 1.2 |
| Example 2 | Co—Cr—Pt—$SiO_2$ | 67-12-15-6 | 50.24-7.94-37.23-4.59 | 1160 | 385 | 9.51 | 0.34 | 1.1 |
| Example 3 | Fe—Pt—$SiO_2$ | 41-41-18 | 20.14-70.35-9.51 | 1200 | 506 | 12.56 | 0.33 | 1.3 |
| Comparative Example 1 | Co—Cr—$SiO_2$ (Cristobalites) | 80.4-12-7.6 | 81.42-10.72-7.84 | 1160 | 11 | 1.27 | 3.1 | 31 |
| Comparative Example 2 | Co—Cr—$SiO_2$ (Cristobalites formed during sintering) | 80.4-12-7.6 | 81.42-10.72-7.84 | 1160 | 11 | 1.23 | 1.76 | 20 |
| Comparative Example 3 | Co—Cr—$SiO_2$ (Amorphous $SiO_2$) | 80.4-12-7.6 | 81.42-10.72-7.84 | 1100 | 11 | 1.24 | 0.48 | 2.9 |
| Comparative Example 4 | Co—Cr—Pt—$SiO_2$ (Cristobalites formed during sintering) | 67-12-15-6 | 50.24-7.94-37.23-4.59 | 1160 | 10 | 1.23 | 1.54 | 23 |
| Comparative Example 5 | Fe—Pt—$SiO_2$ (Cristobalites formed during sintering) | 41-41-18 | 20.14-70.35-9.51 | 1200 | 12 | 1.28 | 2.14 | 25 |
| Example 4 | Co—Pt—$SiO_2$ | 80-12-8 | 62.56-31.06-6.38 | 1160 | 413 | 11.21 | 0.31 | 1.1 |
| Comparative Example 6 | Co—Pt—$SiO_2$ (Cristobalites formed during sintering) | 80-12-8 | 62.56-31.06-6.38 | 1160 | 11 | 1.24 | 1.37 | 24 |
| Example 5 | Co—Cr—Pt—$TiO_2$—$SiO_2$—$Cr_2O_3$ | 69-10-12-3-3-3 | 52.11-6.66-30.00-3.07-2.31-5.84 | 1160 | 152 | 4.13 | 0.31 | 1.2 |
| Comparative Example 7 | Co—Cr—Pt—$TiO_2$—$SiO_2$—$Cr_2O_3$ (Cristobalites formed during sintering) | 69-10-12-3-3-3 | 52.11-6.66-30.00-3.07-2.31-5.84 | 1160 | 11 | 1.23 | 1.38 | 18 |
| Example 6 | Co—Cr—Pt—Ru—$TiO_2$—$SiO_2$—$Cr_2O_3$ | 69-5-15-2-3- | 48.81-3.12-35.13-2.43- | 1160 | 148 | 4.05 | 0.33 | 1.3 |

TABLE 1-continued

|  | Composition | Composition Ratio (mol %) | Composition Ratio (wt %) | Hot Press Temperature (° C.) | 26.64° Strength | Quartz (011) Strength Ratio | Burn-in (kWh) | Particle Count |
|---|---|---|---|---|---|---|---|---|
| Comparative Example 8 | Co—Cr—Pt—Ru—TiO$_2$—SiO$_2$—Cr$_2$O$_3$ (Cristobalites formed during sintering) | 3-3 69-5-15-2-3-3-3 | 2.88-2.16-5.47 48.81-3.12-35.13-2.43-2.88-2.16-5.47 | 1160 | 12 | 1.29 | 1.45 | 19 |
| Example 7 | Co—Cr—Pt—B—SiO$_2$ | 62-18-10-3-7 | 52.24-13.38-27.89-0.46-6.01 | 900 | 377 | 10.24 | 0.26 | 1.2 |
| Comparative Example 9 | Co—Cr—Pt—B—SiO$_2$ (Amorphous SiO$_2$) | 62-18-10-3-7 | 52.24-13.38-27.89-0.46-6.01 | 900 | 12 | 1.28 | 0.47 | 3.1 |
| Example 8 | Co—Cr—Pt—SiO$_2$ | 72-12-15-1 | 54.03-7.94-37.26-0.77 | 1160 | 53 | 1.44 | 0.31 | 1.1 |
| Comparative Example 10 | Co—Cr—Pt—SiO$_2$ | 72-12-15-1 | 54.03-7.94-37.26-0.77 | 1160 | 10 | 1.22 | 1.02 | 10.2 |
| Example 9 | Fe—Pt—SiO$_2$—C | 43-43-9-5 | 21.51-73.64-4.75-0.53 | 1200 | 358 | 8.76 | 0.43 | 9.8 |
| Comparative Example 11 | Fe—Pt—SiO$_2$—C (Cristobalites formed during sintering) | 43-43-9-5 | 21.51-73.64-4.75-0.53 | 1200 | 11 | 1.23 | 2.06 | 31 |

The results upon sputtering this target are shown in Table 1. The number of particles that were generated in a stationary state was 1.2. Upon measuring the number of particles in a stationary state, the deposition thickness was caused to roughly 20 times the film thickness of HDD products for a better view of the particles.

Moreover, the burn-in life of sputtering was 0.25 kWh. Thus, when the peak strength ratio of the quartz of the (011) plane is high, it was possible to shorten the burn-in time and reduce the number of particles that are generated.

The occupancy of SiO$_2$ in the target is shown in Table 2. This is the rate of SiO$_2$ occupancy calculated from the structure photo upon preparing the target. As shown in Table 2, the result was 23.57% in Example 1 and showed a favorable value. The smaller the value in Table 2 is, the greater the amount of SiO$_2$ can be injected within the same volume.

The higher the occupancy of SiO$_2$ in the target is, the more the generation of particles occurs. Thus, the use of high density quartz is advantageous in terms of particles. To put it differently, the lower the occupancy of SiO$_2$ in the case of the same amount of substance, it could be said that the density of the SiO$_2$ itself is high. This point is also evident from the comparison with Comparative Example 1 and Comparative Example 2 below.

TABLE 2

|  | Composition ratio (mol %) | Occupancy of SiO$_2$ calculated from structure photo upon producing the target |
|---|---|---|
| Comparative Example 1 | 80.4Co—12Cr—7.6SiO$_2$ Cristobalite | 25.61% |
| Comparative Example 2 | 80.4Co—12Cr—7.6SiO$_2$ Cristobalite formed during sintering | 28.21% |
| Comparative Example 4 | 67Co—12Cr—15Pt—6SiO$_2$ Cristobalite formed during sintering | 22.5% |
| Comparative Example 5 | 41Fe—41Pt—18SiO$_2$ Cristobalite formed during sintering | 42.53% |
| Example 1 | 80.4Co—12Cr—7.6SiO$_2$ Quartz | 23.57% |
| Example 2 | 67Co—12Cr—15Pt—6SiO$_2$ Quartz | 20.38% |
| Example 3 | 41Fe—41Pt—18SiO$_2$ Quartz | 39.10% |

Example 2

In Example 2, as the raw material powders, Co powder having an average grain size of 3 μm, Cr powder having an average grain size of 5 μm, Pt powder having an average grain size of 1 μm, and quartz powder (SiO$_2$ powder) having an average grain size of 1 μm were prepared. These powders were weighed at the weight percentage of Co powder 50.24 wt %, Cr powder 7.94 wt %, Pt powder 37.23 wt %, and SiO$_2$ powder 4.59 wt % to achieve a target composition of 67 Co-12 Cr-15 Pt-6 SiO$_2$ (mol %).

This mixed powder was filled in a carbon mold, and hot pressed in a vacuum atmosphere under the conditions of: temperature of 1160° C., holding time of 120 minutes, and pressure of 30 MPa to obtain a sintered compact. This was further processed with a lathe to obtain a disk-shaped target having a diameter of 180 mm and thickness of 5 mm.

The peak strength of quartz was measured by cutting out a part of the target and performing measurement based on the X-ray diffraction method. The results are shown in Table 1.

The peak strength appearing at 2θ:26.64° was 385, and the background strength (((average value of strength of 25.1 to 26.1°)+(average value of strength of 27.1 to) 28.1°)÷2) was also measured.

The peak strength ratio of the quartz of the (011) plane relative to the background strength, i.e. quartz peak strength/background strength, was 9.51. The measuring device was Ultima IV by Rigaku, and the conditions were as follows: tube voltage of 40 kv, tube current of 30 mA, scan speed of 4°/min, and step of 0.02°.

The results upon sputtering this target are shown in Table 1. The number of particles that were generated in a stationary state was 1.1. Upon measuring the number of particles in a stationary state, the deposition thickness was caused to roughly 20 times the film thickness of HDD products for a better view of the particles.

Moreover, the burn-in life of sputtering was 0.34 kWh. Thus, when the peak strength ratio of the quartz of the (011) plane is high, it was possible to shorten the burn-in time and reduce the number of particles that are generated.

The occupancy of SiO$_2$ in the target is shown in Table 2. This is the rate of SiO$_2$ occupancy calculated from the structure photo upon preparing the target. As shown in Table 2, the SiO$_2$ occupancy was 20.38% in Example 2 and showed a favorable value. The smaller the value shown in Table 2 is, the greater the amount of SiO$_2$ can be injected within the same volume.

The higher the occupancy of $SiO_2$ in the target is, the more the generation of particles occurs. Thus, the use of high density quartz is advantageous in terms of particles. To put it differently, the lower the occupancy of $SiO_2$ in the case of the same amount of substance, it could be said that the density of the $SiO_2$ itself is high. This point is also evident from the comparison with Comparative Example 4 below.

Example 3

In Example 3, as the raw material powders, Fe powder having an average grain size of 5 μm, Pt powder having an average grain size of 1 μm, and quartz powder ($SiO_2$ powder) having an average grain size of 1 μm were prepared. These powders were weighed at the weight percentage of Fe powder 20.14 wt %, Pt powder 70.35 wt %, and $SiO_2$ powder 9.51 wt % to achieve a target composition of 41 Fe-41 Pt-18 $SiO_2$ (mol %).

This mixed powder was filled in a carbon mold, and hot pressed in a vacuum atmosphere under the conditions of temperature of 1200° C., holding time of 120 minutes, and pressure of 30 MPa to obtain a sintered compact. This was further processed with a lathe to obtain a disk-shaped target having a diameter of 180 mm and thickness of 5 mm.

The peak strength of quartz was measured by cutting out a part of the target and performing measurement based on the X-ray diffraction method. The results are shown in Table 1.

The peak strength appearing at 2θ:26.64° was 506, and the background strength (((average value of strength of 25.1 to 26.1°)+(average value of strength of 27.1 to) 28.1°)÷2) was also measured.

The peak strength ratio of the quartz of the (011) plane relative to the background strength, i.e. quartz peak strength/background strength, was 12.56. The measuring device was Ultima IV by Rigaku, and the conditions were as follows: tube voltage of 40 kv, tube current of 30 mA, scan speed of 4°/min, and step of 0.02°.

The results upon sputtering this target are shown in Table 1. The number of particles that were generated in a stationary state was 1.3. Upon measuring the number of particles in a stationary state, the deposition thickness was caused to roughly 20 times the film thickness of HDD products for a better view of the particles.

Moreover, the burn-in life of sputtering was 0.33 kWh. Thus, when the peak strength ratio of the quartz of the (011) plane is high, it was possible to shorten the burn-in time and reduce the number of particles that are generated.

The occupancy of $SiO_2$ in the target is shown in Table 2. This is the rate of $SiO_2$ occupancy calculated from the structure photo upon preparing the target. As shown in Table 2, the $SiO_2$ occupancy was 39.10% in Example 3 and showed a favorable value compared to a target of the same composition. The smaller the value shown in Table 2 is, the greater the amount of $SiO_2$ can be injected within the same volume.

The higher the occupancy of $SiO_2$ in the target is, the more the generation of particles occurs. Thus, the use of high density quartz is advantageous in terms of particles. To put it differently, the lower the occupancy of $SiO_2$ in the case of the same amount of substance, it could be said that the density of the $SiO_2$ itself is high. This point is also evident from the comparison with Comparative Example 5 below.

Comparative Example 1

In Comparative Example 1, as the raw material powders, Co powder having an average grain size of 3 μm, Cr powder having an average grain size of 5 μm, and crystalline $SiO_2$ powder (cristobalite powder) having an average grain size of 1 μm were prepared. These powders were weighed at the weight percentage of Co powder 81.42 wt %, Cr powder 10.72 wt %, and $SiO_2$ powder 7.84 wt % to achieve a target composition of 80.4 Co-12 Cr-7.6 $SiO_2$ (mol %).

Next, these powders were placed in a ball mill pot with a capacity of 10 liters together with zirconia balls as the grinding medium, and rotated and mixed for 20 hours.

Then, this mixed powder was filled in a carbon mold, and hot pressed in a vacuum atmosphere under the conditions of temperature of 1160° C., holding time of 120 minutes, and pressure of 30 MPa to obtain a sintered compact.

Figure 2:
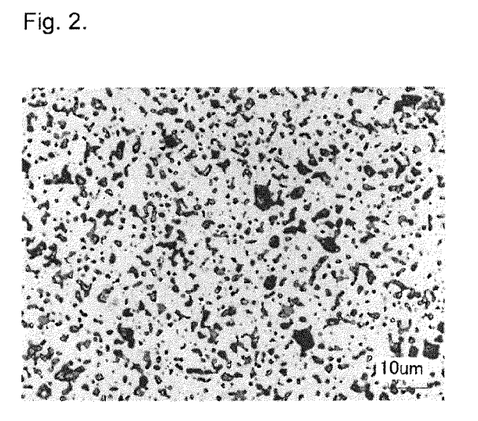
FIG. 2 is a structure photo of the target of Comparative Example 1 which uses a cristobalite.

This was further processed with a lathe to obtain a disk-shaped target having a diameter of 180 mm and thickness of 5 mm. The structure photo of this target is shown in FIG. 2, and numerous $SiO_2$ subject to grain growth can be observed.

As with Example 1, the peak strength of the (011) plane of the quartz was measured by cutting out a part of the target and performing measurement based on the X-ray diffraction method. In other words, the peak strength appearing at 2θ:26.64° and the background strength (((average value of strength of 25.1 to 26.1°)+(average value of strength of 27.1 to) 28.1°)÷2) were measured.

Consequently, the peak strength appearing at 2θ:26.64° was 11, and the peak strength ratio of the (011) plane of the quartz relative to the background strength, i.e. quartz peak strength/background strength, was 1.27.

These were both smaller compared to Example 1. The results are shown in Table 1. Here, the measuring device and conditions were the same as Example 1.

As a result of sputtering this target, the number of particles that were generated in a stationary state increased to 31. Moreover, the burn-in life of sputtering was 3.1 kWh, and the burn-in time increased. Thus, when the peak strength ratio of the (011) plane of the quartz decreased, the burn-in time of sputtering increased, and the number of particles that are generated during sputtering also increased. The results are shown in Table 1.

The occupancy of $SiO_2$ in the target is shown in Table 2. This is the rate of $SiO_2$ occupancy calculated from the structure photo upon preparing the target. The result shown in Table 2 was 25.61%. The value is greater compared to the Examples.

When the value shown in Table 2 is great, it is not possible to inject a greater amount of $SiO_2$ within the same volume. The higher the occupancy of $SiO_2$ in the target is, the more the generation of particles occurs. Thus, the use of high density quartz is advantageous in terms of particles, but the opposite result was obtained in this Comparative Example. To put it differently, since the $SiO_2$ occupancy is great in the same amount of substance, the $SiO_2$ density had deteriorated by that much.

Comparative Example 2

In Comparative Example 2, as the raw material powders, Co powder having an average grain size of 3 μm, Cr powder having an average grain size of 5 μm, and $SiO_2$ powder (amorphous $SiO_2$ powder) having an average grain size of 1 μm were prepared. These powders were weighed at the weight percentage of Co powder 81.42 wt %, Cr powder 10.72 wt %, and $SiO_2$ powder 7.84 wt % to achieve a target composition of 80.4 Co-12 Cr-7.6 $SiO_2$ (mol %).

Next, these powders were placed in a ball mill pot with a capacity of 10 liters together with zirconia balls as the grinding medium, and rotated and mixed for 20 hours.

Then, this mixed powder was filled in a carbon mold, and hot pressed in a vacuum atmosphere under the conditions of temperature of 1160° C., holding time of 120 minutes, and pressure of 30 MPa to obtain a sintered compact.

Figure 3:
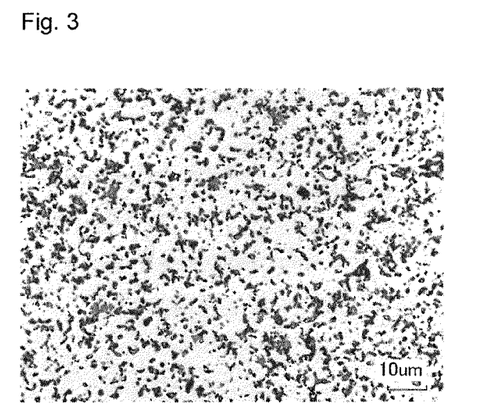
FIG. 3 is a structure photo of the target of Comparative Example 2 in which amorphous $SiO_2$ is formed into a cristobalite.

This was further processed with a lathe to obtain a disk-shaped target having a diameter of 180 mm and thickness of 5 mm. Note that, in the foregoing production process, the amorphous $SiO_2$ was formed into cristobalites. The structure photo of this target is shown in FIG. 3. In FIG. 3, some $SiO_2$ subject to grain growth can be observed.

As with Example 1, the peak strength of the (011) plane of the quartz was measured by cutting out a part of the target and performing measurement based on the X-ray diffraction method. In other words, the peak strength appearing at 2θ:26.64° and the background strength (((average value of strength of 25.1 to 26.1°)+(average value of strength of 27.1 to) 28.1°)÷2) were measured.

Consequently, the peak strength appearing at 2θ:26.64° was 11, and the peak strength ratio of the (011) plane of the quartz relative to the background strength, i.e. quartz peak strength/background strength, was 1.23.

These were both smaller compared to Example 1. The results are shown in Table 1. Here, the measuring device and conditions were the same as Example 1.

As a result of sputtering this target, the number of particles that were generated in a stationary state increased to 20. Moreover, the burn-in life of sputtering was 1.76 kWh, and the burn-in time increased. Thus, when the peak strength ratio of the (011) plane of the quartz decreased, the burn-in time of sputtering increased, and the number of particles that are generated during sputtering also increased. The results are shown in Table 1.

The occupancy of $SiO_2$ in the target is shown in Table 2. This is the rate of $SiO_2$ occupancy calculated from the structure photo upon preparing the target. As shown in Table 2, the result was 28.21%, and this value is greater compared to the Examples.

In Table 2, the smaller the value upon comparing the same compositions, it is not possible to inject a greater amount of $SiO_2$ within the same volume. The higher the occupancy of $SiO_2$ in the target is, the more the generation of particles occurs. Thus, while the use of high density quartz is advantageous in terms of particles, the opposite result was obtained in Comparative Example 2. To put it differently, since the $SiO_2$ occupancy is great in the same amount of substance, the $SiO_2$ density had deteriorated by that much.

Comparative Example 3

In Comparative Example 3, as the raw material powders, Co powder having an average grain size of 3 μm, Cr powder having an average grain size of 5 μm, and $SiO_2$ powder (amorphous $SiO_2$ powder) having an average grain size of 1 μm were prepared. These powders were weighed at the weight percentage of Co powder 81.42 wt %, Cr powder 10.72 wt %, and $SiO_2$ powder 7.84 wt % to achieve a target composition of 80.4 Co-12 Cr-7.6 $SiO_2$ (mol %).

Next, these powders were placed in a ball mill pot with a capacity of 10 liters together with zirconia balls as the grinding medium, and rotated and mixed for 20 hours.

Then, this mixed powder was filled in a carbon mold, and hot pressed in a vacuum atmosphere under the conditions of temperature of 1100° C., holding time of 120 minutes, and pressure of 30 MPa to obtain a sintered compact.

This was further processed with a lathe to obtain a disk-shaped target having a diameter of 180 mm and thickness of 5 mm. With the structure of this target, some $SiO_2$ subject to grain growth can be observed.

As with Example 1, the peak strength of the (011) plane of the quartz was measured by cutting out a part of the target and performing measurement based on the X-ray diffraction method. In other words, the peak strength appearing at 2θ:26.64° and the background strength (((average value of strength of 25.1 to 26.1°)+(average value of strength of 27.1 to) 28.1°)÷2) were measured.

Consequently, the peak strength appearing at 2θ:26.64° was 11, and the peak strength ratio of the (011) plane of the quartz relative to the background strength, i.e. quartz peak strength/background strength, was 1.24.

These were both smaller compared to Example 1. The results are shown in Table 1. Here, the measuring device and conditions were the same as Example 1.

As a result of sputtering this target, the number of particles that were generated in a stationary state increased to 2.9. Moreover, the burn-in life of sputtering was 0.48 kWh, and the burn-in time increased. Thus, when the peak strength ratio of the (011) plane of the quartz decreased, the burn-in time of sputtering increased, and the number of particles that are generated during sputtering also increased. The results are shown in Table. 1.

Comparative Example 4

In Comparative Example 4, as the raw material powders, Co powder having an average grain size of 3 μm, Cr powder having an average grain size of 5 μm, Pt powder having an average grain size of 1 μm, and $SiO_2$ powder (amorphous $SiO_2$ powder) having an average grain size of 1 μm were prepared. These powders were weighed at the weight percentage of Co powder 50.24 wt %, Cr powder 7.94 wt %, Pt powder 37.23 wt %, and $SiO_2$ powder 4.59 wt % to achieve a target composition of 67 Co-12 Cr-15 Pt-6 $SiO_2$ (mol %).

Next, these powders were placed in a ball mill pot with a capacity of 10 liters together with zirconia balls as the grinding medium, and rotated and mixed for 20 hours.

Then, this mixed powder was filled in a carbon mold, and hot pressed in a vacuum atmosphere under the conditions of temperature of 1160° C., holding time of 120 minutes, and pressure of 30 MPa to obtain a sintered compact.

This was further processed with a lathe to obtain a disk-shaped target having a diameter of 180 mm and thickness of 5 mm. Note that, in the foregoing production process, the amorphous $SiO_2$ was formed into cristobalites. With the structure of this target, some $SiO_2$ subject to grain growth can be observed.

As with Example 1, the peak strength of the (011) plane of the quartz was measured by cutting out a part of the target and performing measurement based on the X-ray diffraction method. In other words, the peak strength appearing at 2θ:26.64° and the background strength (((average value of strength of 25.1 to 26.1°)+(average value of strength of 27.1 to) 28.1°)÷2) were measured.

Consequently, the peak strength appearing at 2θ:26.64° was 10, and the peak strength ratio of the (011) plane of the quartz relative to the background strength, i.e. quartz peak strength/background strength, was 1.23.

These were both smaller compared to Example 2. The results are shown in Table 1. Here, the measuring device and conditions were the same as Example 1.

As a result of sputtering this target, the number of particles that were generated in a stationary state increased to 23. Moreover, the burn-in life of sputtering was 1.54 kWh, and the burn-in time increased. Thus, when the peak strength ratio of the (011) plane of the quartz decreased, the burn-in time of sputtering increased, and the number of particles that are generated during sputtering also increased. The results are shown in Table 1.

Comparative Example 5

In Comparative Example 5, as the raw material powders, Fe powder having an average grain size of 5 μm, Pt powder having an average grain size of 1 μm, and $SiO_2$ powder (amorphous $SiO_2$ powder) having an average grain size of 1 μm were prepared. These powders were weighed at the weight percentage of Fe powder 20.14 wt %, Pt powder 70.35 wt %, and $SiO_2$ powder 9.51 wt % to achieve a target composition of 41 Fe-41 Pt-18 $SiO_2$ (mol %).

Next, these powders were placed in a ball mill pot with a capacity of 10 liters together with zirconia balls as the grinding medium, and rotated and mixed for 20 hours.

Then, this mixed powder was filled in a carbon mold, and hot pressed in a vacuum atmosphere under the conditions of temperature of 1200° C., holding time of 120 minutes, and pressure of 30 MPa to obtain a sintered compact.

This was further processed with a lathe to obtain a disk-shaped target having a diameter of 180 mm and thickness of 5 mm. Note that, in the foregoing production process, the amorphous $SiO_2$ was formed into cristobalites. With the structure of this target, some $SiO_2$ subject to grain growth can be observed.

As with Example 1, the peak strength of the (011) plane of the quartz was measured by cutting out a part of the target and performing measurement based on the X-ray diffraction method. In other words, the peak strength appearing at 2θ:26.64° and the background strength (((average value of strength of 25.1 to 26.1°)+(average value of strength of 27.1 to) 28.1°)÷2) were measured.

Consequently, the peak strength appearing at 2θ:26.64° was 12, and the peak strength ratio of the (011) plane of the quartz relative to the background strength, i.e. quartz peak strength/background strength, was 1.28.

These were both smaller compared to Example 3. The results are shown in Table 1. Here, the measuring device and conditions were the same as Example 1.

As a result of sputtering this target, the number of particles that were generated in a stationary state increased to 25. Moreover, the burn-in life of sputtering was 2.14 kWh, and the burn-in time increased. Thus, when the peak strength ratio of the (011) plane of the quartz decreased, the burn-in time of sputtering increased, and the number of particles that are generated during sputtering also increased. The results are shown in Table 1.

Example 4

In Example 4, as the raw material powders, Co powder having an average grain size of 3 μm, Pt powder having an average grain size of 1 μm, and quartz powder ($SiO_2$ powder) having an average grain size of 1 μm were prepared. These powders were weighed at the weight percentage of Co powder 62.56 wt %, Pt powder 31.06 wt %, and $SiO_2$ powder 6.38 wt % to achieve a target composition of 80 Co-12 Pt-8 $SiO_2$ (mol %).

This mixed powder was filled in a carbon mold, and hot pressed in a vacuum atmosphere under the conditions of temperature of 1160° C., holding time of 120 minutes, and pressure of 30 MPa to obtain a sintered compact. This was further processed with a lathe to obtain a disk-shaped target having a diameter of 180 mm and thickness of 5 mm.

The peak strength of quartz was measured by cutting out a part of the target and performing measurement based on the X-ray diffraction method. The results are shown in Table 1.

The peak strength appearing at 2θ:26.64° was 413, and the background strength (((average value of strength of 25.1 to 26.1°)+(average value of strength of 27.1 to) 28.1°)÷2) was also measured.

The peak strength ratio of the quartz of the (011) plane relative to the background strength, i.e. quartz peak strength/background strength, was 11.21. The measuring device was Ultima IV by Rigaku, and the conditions were as follows: tube voltage of 40 kv, tube current of 30 mA, scan speed of 4°/min, and step of 0.02°.

The results upon sputtering this target are shown in Table 1. The number of particles that were generated in a stationary state was 1.1. Upon measuring the number of particles in a stationary state, the deposition thickness was caused to roughly 20 times the film thickness of HDD products for a better view of the particles.

Moreover, the burn-in life of sputtering was 0.31 kWh. Thus, when the peak strength ratio of the quartz of the (011) plane is high, it was possible to shorten the burn-in time and reduce the number of particles that are generated.

Comparative Example 6

In Comparative Example 6, as the raw material powders, Co powder having an average grain size of 3 μm, Pt powder having an average grain size of 1 μm, and $SiO_2$ powder (amorphous $SiO_2$ powder) having an average grain size of 1 μm were prepared. These powders were weighed at the weight percentage of Co powder 62.56 wt %, Pt powder 31.06 wt %, and $SiO_2$ powder 6.38 wt % to achieve a target composition of 80 Co-12 Pt-8 $SiO_2$ (mol %).

Next, these powders were placed in a ball mill pot with a capacity of 10 liters together with zirconia balls as the grinding medium, and rotated and mixed for 20 hours.

Then, this mixed powder was filled in a carbon mold, and hot pressed in a vacuum atmosphere under the conditions of temperature of 1160° C., holding time of 120 minutes, and pressure of 30 MPa to obtain a sintered compact.

This was further processed with a lathe to obtain a disk-shaped target having a diameter of 180 mm and thickness of 5 mm. Note that, in the foregoing production process, the amorphous $SiO_2$ was formed into cristobalites. With the structure photo of this target, some $SiO_2$ subject to grain growth can be observed.

As with Example 1, the peak strength of the (011) plane of the quartz was measured by cutting out a part of the target and performing measurement based on the X-ray diffraction method. In other words, the peak strength appearing at 2θ:26.64° and the background strength (((average value of strength of 25.1 to 26.1°)+(average value of strength of 27.1 to) 28.1°)÷2) were measured.

Consequently, the peak strength appearing at 2θ:26.64° was 11, and the peak strength ratio of the (011) plane of the quartz relative to the background strength, i.e. quartz peak strength/background strength, was 1.24.

These were both smaller compared to Example 4. The results are shown in Table 1. Here, the measuring device and conditions were the same as Example 1.

As a result of sputtering this target, the number of particles that were generated in a stationary state increased to 24. Moreover, the burn-in life of sputtering was 1.37 kWh, and the burn-in time increased. Thus, when the peak strength ratio of the (011) plane of the quartz decreased, the burn-in time of sputtering increased, and the number of particles that are generated during sputtering also increased. The results are shown in Table 1.

Example 5

In Example 5, as the raw material powders, Co powder having an average grain size of 3 μm, Cr powder having an average grain size of 5 μm, Pt powder having an average grain size of 1 μm, TiO$_2$ powder having an average grain size of 1 μm, quartz powder (SiO$_2$ powder) having an average grain size of 1 μm, and Cr$_2$O$_3$ powder having an average grain size of 1 μm were prepared. These powders were weighed at the weight percentage of Co powder 52.11 wt %, Cr powder 6.66 wt %, Pt powder 30.00 wt %, TiO$_2$ powder 3.07 wt %, SiO$_2$ powder 2.31 wt %, and Cr$_2$O$_3$ powder 5.84 wt % to achieve a target composition of 69 Co-10 Cr-12 Pt-3 TiO$_2$-3 SiO$_2$-3 Cr$_2$O$_3$ (mol %).

This mixed powder was filled in a carbon mold, and hot pressed in a vacuum atmosphere under the conditions of temperature of 1160° C., holding time of 120 minutes, and pressure of 30 MPa to obtain a sintered compact. This was further processed with a lathe to obtain a disk-shaped target having a diameter of 180 mm and thickness of 5 mm.

The peak strength of quartz was measured by cutting out a part of the target and performing measurement based on the X-ray diffraction method. The results are shown in Table 1.

The peak strength appearing at 2θ:26.64° was 152, and the background strength (((average value of strength of 25.1 to 26.1°)+(average value of strength of 27.1 to) 28.1°)÷2) was also measured.

The peak strength ratio of the quartz of the (011) plane relative to the background strength, i.e. quartz peak strength/background strength, was 4.13. The measuring device was Ultima IV by Rigaku, and the conditions were as follows: tube voltage of 40 kv, tube current of 30 mA, scan speed of 4°/min, and step of 0.02°.

The results upon sputtering this target are shown in Table 1. The number of particles that were generated in a stationary state was 1.2. Upon measuring the number of particles in a stationary state, the deposition thickness was caused to roughly 20 times the film thickness of HDD products for a better view of the particles.

Moreover, the burn-in life of sputtering was 0.31 kWh. Thus, when the peak strength ratio of the quartz of the (011) plane is high, it was possible to shorten the burn-in time and reduce the number of particles that are generated.

Comparative Example 7

In Comparative Example 7, as the raw material powders, Co powder having an average grain size of 3 μm, Cr powder having an average grain size of 5 μm, Pt powder having an average grain size of 1 μm, TiO$_2$ powder having an average grain size of 1 μm, quartz powder (amorphous SiO$_2$ powder) having an average grain size of 1 μm, and Cr$_2$O$_3$ powder having an average grain size of 1 μm were prepared. These powders were weighed at the weight percentage of Co powder 52.11 wt %, Cr powder 6.66 wt %, Pt powder 30.00 wt %, TiO$_2$ powder 3.07 wt %, SiO$_2$ powder 2.31 wt %, and Cr$_2$O$_3$ powder 5.84 wt % to achieve a target composition of 69 Co-10 Cr-12 Pt-3 TiO$_2$-3 SiO$_2$-3 Cr$_2$O$_3$ (mol %).

Next, these powders were placed in a ball mill pot with a capacity of 10 liters together with zirconia balls as the grinding medium, and rotated and mixed for 20 hours.

Then, this mixed powder was filled in a carbon mold, and hot pressed in a vacuum atmosphere under the conditions of temperature of 1160° C., holding time of 120 minutes, and pressure of 30 MPa to obtain a sintered compact.

This was further processed with a lathe to obtain a disk-shaped target having a diameter of 180 mm and thickness of 5 mm. Note that, in the foregoing production process, the amorphous SiO$_2$ was formed into cristobalites. With the structure of this target, some SiO$_2$ subject to grain growth can be observed.

As with Example 1, the peak strength of the (011) plane of the quartz was measured by cutting out a part of the target and performing measurement based on the X-ray diffraction method. In other words, the peak strength appearing at 2θ:26.64° and the background strength (((average value of strength of 25.1 to 26.1°)+(average value of strength of 27.1 to) 28.1°)÷2) were measured.

Consequently, the peak strength appearing at 2θ:26.64° was 11, and the peak strength ratio of the (011) plane of the quartz relative to the background strength, i.e. quartz peak strength/background strength, was 1.23.

These were both smaller compared to Example 5. The results are shown in Table 1. Here, the measuring device and conditions were the same as Example 1.

As a result of sputtering this target, the number of particles that were generated in a stationary state increased to 18. Moreover, the burn-in life of sputtering was 1.38 kWh, and the burn-in time increased. Thus, when the peak strength ratio of the (011) plane of the quartz decreased, the burn-in time of sputtering increased, and the number of particles that are generated during sputtering also increased. The results are shown in Table 1.

Example 6

In Example 6, as the raw material powders, Co powder having an average grain size of 3 μm, Cr powder having an average grain size of 5 μm, Ru powder having an average grain size of 8 μm, Pt powder having an average grain size of 1 μm, TiO$_2$ powder having an average grain size of 1 μm, quartz powder (SiO$_2$ powder) having an average grain size of 1 μm, and Cr$_2$O$_3$ powder having an average grain size of 1 μm were prepared. These powders were weighed at the weight percentage of Co powder 48.81 wt %, Cr powder 3.12 wt %, Pt powder 35.13 wt %, Ru powder 2.43 wt %, TiO$_2$ powder 2.88 wt %, SiO$_2$ powder 2.16 wt %, and Cr$_2$O$_3$ powder 5.47 wt % to achieve a target composition of 69 Co-5 Cr-15 Pt-2 Ru-3 TiO$_2$-3 SiO$_2$-3 Cr$_2$O$_3$ (mol %).

This mixed powder was filled in a carbon mold, and hot pressed in a vacuum atmosphere under the conditions of temperature of 1160° C., holding time of 120 minutes, and pressure of 30 MPa to obtain a sintered compact. This was further processed with a lathe to obtain a disk-shaped target having a diameter of 180 mm and thickness of 5 mm.

The peak strength of quartz was measured by cutting out a part of the target and performing measurement based on the X-ray diffraction method. The results are shown in Table 1.

The peak strength appearing at 2θ:26.64° was 148, and the background strength (((average value of strength of 25.1 to 26.1°)+(average value of strength of 27.1 to) 28.1°)÷2) was also measured.

The peak strength ratio of the quartz of the (011) plane relative to the background strength, i.e. quartz peak strength/ background strength, was 4.05. The measuring device was Ultima IV by Rigaku, and the conditions were as follows: tube voltage of 40 kv, tube current of 30 mA, scan speed of 4°/min, and step of 0.02°.

The results upon sputtering this target are shown in Table 1. The number of particles that were generated in a stationary state was 1.3. Upon measuring the number of particles in a stationary state, the deposition thickness was caused to roughly 20 times the film thickness of HDD products for a better view of the particles.

Moreover, the burn-in life of sputtering was 0.33 kWh. Thus, when the peak strength ratio of the quartz of the (011) plane is high, it was possible to shorten the burn-in time and reduce the number of particles that are generated.

Comparative Example 8

In Comparative Example 8, as the raw material powders, Co powder having an average grain size of 3 μm, Cr powder having an average grain size of 5 μm, Ru powder having an average grain size of 8 μm, Pt powder having an average grain size of 1 μm, $TiO_2$ powder having an average grain size of 1 μm, quartz powder (amorphous $SiO_2$ powder) having an average grain size of 1 μm, and $Cr_2O_3$ powder having an average grain size of 1 μm were prepared. These powders were weighed at the weight percentage of Co powder 48.81 wt %, Cr powder 3.12 wt %, Pt powder 35.13 wt %, Ru powder 2.43 wt %, $TiO_2$ powder 2.88 wt %, $SiO_2$ powder 2.16 wt %, and $Cr_2O_3$ powder 5.47 wt % to achieve a target composition of 69 Co-5 Cr-15 Pt-2 Ru-3 $TiO_2$-3 $SiO_2$-3 $Cr_2O_3$ (mol %).

Next, these powders were placed in a ball mill pot with a capacity of 10 liters together with zirconia balls as the grinding medium, and rotated and mixed for 20 hours.

Then, this mixed powder was filled in a carbon mold, and hot pressed in a vacuum atmosphere under the conditions of temperature of 1160° C., holding time of 120 minutes, and pressure of 30 MPa to obtain a sintered compact.

This was further processed with a lathe to obtain a disk-shaped target having a diameter of 180 mm and thickness of 5 mm. Note that, in the foregoing production process, the amorphous $SiO_2$ was formed into cristobalites. With the structure of this target, some $SiO_2$ subject to grain growth can be observed.

As with Example 1, the peak strength of the (011) plane of the quartz was measured by cutting out a part of the target and performing measurement based on the X-ray diffraction method. In other words, the peak strength appearing at 2θ:26.64° and the background strength (((average value of strength of 25.1 to 26.1°)+(average value of strength of 27.1 to) 28.1°)÷2) were measured.

Consequently, the peak strength appearing at 2θ:26.64° was 12, and the peak strength ratio of the (011) plane of the quartz relative to the background strength, i.e. quartz peak strength/background strength, was 1.29.

These were both smaller compared to Example 6. The results are shown in Table 1. Here, the measuring device and conditions were the same as Example 1.

As a result of sputtering this target, the number of particles that were generated in a stationary state increased to 19. Moreover, the burn-in life of sputtering was 1.45 kWh, and the burn-in time increased. Thus, when the peak strength ratio of the (011) plane of the quartz decreased, the burn-in time of sputtering increased, and the number of particles that are generated during sputtering also increased. The results are shown in Table 1.

Example 7

In Example 7, as the raw material powders, Co powder having an average grain size of 3 μm, Cr powder having an average grain size of 5 μm, Pt powder having an average grain size of 1 μm, B powder having an average grain size of 3 μm, and quartz powder ($SiO_2$ powder) having an average grain size of 1 μm were prepared. These powders were weighed at the weight percentage of Co powder 52.24 wt %, Cr powder 13.38 wt %, Pt powder 27.89 wt %, B powder 0.46 wt %, and $SiO_2$ powder 6.01 wt % to achieve a target composition of 62 Co-18 Cr-10 Pt-3 B-7 $SiO_2$ (mol %).

This mixed powder was filled in a carbon mold, and hot pressed in a vacuum atmosphere under the conditions of temperature of 900° C., holding time of 120 minutes, and pressure of 30 MPa to obtain a sintered compact. This was further processed with a lathe to obtain a disk-shaped target having a diameter of 180 mm and thickness of 5 mm.

The peak strength of quartz was measured by cutting out a part of the target and performing measurement based on the X-ray diffraction method. The results are shown in Table 1.

The peak strength appearing at 2θ:26.64° was 377, and the background strength (((average value of strength of 25.1 to 26.1°)+(average value of strength of 27.1 to) 28.1°)÷2) was also measured.

The peak strength ratio of the quartz of the (011) plane relative to the background strength, i.e. quartz peak strength/background strength, was 10.24. The measuring device was Ultima IV by Rigaku, and the conditions were as follows: tube voltage of 40 kv, tube current of 30 mA, scan speed of 4°/min, and step of 0.02°.

The results upon sputtering this target are shown in Table 1. The number of particles that were generated in a stationary state was 1.2. Upon measuring the number of particles in a stationary state, the deposition thickness was caused to roughly 20 times the film thickness of HDD products for a better view of the particles.

Moreover, the burn-in life of sputtering was 0.26 kWh. Thus, when the peak strength ratio of the quartz of the (011) plane is high, it was possible to shorten the burn-in time and reduce the number of particles that are generated.

Comparative Example 9

In Comparative Example 9, as the raw material powders, Co powder having an average grain size of 3 μm, Cr powder having an average grain size of 5 μm, Pt powder having an average grain size of 1 μm, B powder having an average grain size of 3 μm, and quartz powder (amorphous $SiO_2$ powder) having an average grain size of 1 μm were prepared. These powders were weighed at the weight percentage of Co powder 52.24 wt %, Cr powder 13.38 wt %, Pt powder 27.89 wt %, B powder 0.46 wt %, and $SiO_2$ powder 6.01 wt % to achieve a target composition of 62 Co-18 Cr-10 Pt-3 B-7 $SiO_2$ (mol %).

Next, these powders were placed in a ball mill pot with a capacity of 10 liters together with zirconia balls as the grinding medium, and rotated and mixed for 20 hours.

Then, this mixed powder was filled in a carbon mold, and hot pressed in a vacuum atmosphere under the conditions of temperature of 900° C., holding time of 120 minutes, and pressure of 30 MPa to obtain a sintered compact.

This was further processed with a lathe to obtain a disk-shaped target having a diameter of 180 mm and thickness of 5 mm. With the structure photo of this target, some $SiO_2$ subject to grain growth can be observed.

As with Example 1, the peak strength of the (011) plane of the quartz was measured by cutting out a part of the target and performing measurement based on the X-ray diffraction method. In other words, the peak strength appearing at $2\theta:26.64°$ and the background strength (((average value of strength of 25.1 to 26.1°)+(average value of strength of 27.1 to) 28.1°)÷2) were measured.

Consequently, the peak strength appearing at $2\theta:26.64°$ was 12, and the peak strength ratio of the (011) plane of the quartz relative to the background strength, i.e. quartz peak strength/background strength, was 1.28.

These were both smaller compared to Example 7. The results are shown in Table 1. Here, the measuring device and conditions were the same as Example 1.

As a result of sputtering this target, the number of particles that were generated in a stationary state increased to 3.1. Moreover, the burn-in life of sputtering was 0.47 kWh, and the burn-in time increased. Thus, when the peak strength ratio of the (011) plane of the quartz decreased, the burn-in time of sputtering increased, and the number of particles that are generated during sputtering also increased. The results are shown in Table 1.

Example 8

In Example 8, as the raw material powders, Co powder having an average grain size of 3 μm, Cr powder having an average grain size of 5 μm, Pt powder having an average grain size of 1 μm, and quartz powder ($SiO_2$ powder) having an average grain size of 1 μm were prepared. These powders were weighed at the weight percentage of Co powder 54.03 wt %, Cr powder 7.94 wt %, Pt powder 37.26 wt %, and $SiO_2$ powder 0.77 wt % to achieve a target composition of 72 Co-12 Cr-15 Pt—$SiO_2$ (mol %).

This mixed powder was filled in a carbon mold, and hot pressed in a vacuum atmosphere under the conditions of temperature of 1160° C., holding time of 120 minutes, and pressure of 30 MPa to obtain a sintered compact. This was further processed with a lathe to obtain a disk-shaped target having a diameter of 180 mm and thickness of 5 mm.

The peak strength of quartz was measured by cutting out a part of the target and performing measurement based on the X-ray diffraction method. The results are shown in Table 1.

The peak strength appearing at $2\theta:26.64°$ was 53, and the background strength (((average value of strength of 25.1 to 26.1°)+(average value of strength of 27.1 to) 28.1°)÷2) was also measured.

The peak strength ratio of the quartz of the (011) plane relative to the background strength, i.e. quartz peak strength/background strength, was 1.44. The measuring device was Ultima IV by Rigaku, and the conditions were as follows: tube voltage of 40 kv, tube current of 30 mA, scan speed of 4°/min, and step of 0.02°.

The results upon sputtering this target are shown in Table 1. The number of particles that were generated in a stationary state was 1.1. Upon measuring the number of particles in a stationary state, the deposition thickness was caused to roughly 20 times the film thickness of HDD products for a better view of the particles.

Moreover, the burn-in life of sputtering was 0.31 kWh. Thus, when the peak strength ratio of the quartz of the (011) plane is high, it was possible to shorten the burn-in time and reduce the number of particles that are generated.

Comparative Example 10

In Comparative Example 10, as the raw material powders, Co powder having an average grain size of 3 μm, Cr powder having an average grain size of 5 μm, Pt powder having an average grain size of 1 μm, and quartz powder (amorphous $SiO_2$ powder) having an average grain size of 1 μm were prepared. These powders were weighed at the weight percentage of Co powder 54.03 wt %, Cr powder 7.94 wt %, Pt powder 37.26 wt %, and $SiO_2$ powder 0.77 wt % to achieve a target composition of 72 Co-12 Cr-15 Pt—$SiO_2$ (mol %).

Next, these powders were placed in a ball mill pot with a capacity of 10 liters together with zirconia balls as the grinding medium, and rotated and mixed for 20 hours.

Then, this mixed powder was filled in a carbon mold, and hot pressed in a vacuum atmosphere under the conditions of temperature of 1160° C., holding time of 120 minutes, and pressure of 30 MPa to obtain a sintered compact.

This was further processed with a lathe to obtain a disk-shaped target having a diameter of 180 mm and thickness of 5 mm. Note that, in the foregoing production process, the amorphous $SiO_2$ was formed into cristobalites. With the structure photo of this target, some $SiO_2$ subject to grain growth can be observed.

As with Example 1, the peak strength of the (011) plane of the quartz was measured by cutting out a part of the target and performing measurement based on the X-ray diffraction method. In other words, the peak strength appearing at $2\theta:26.64°$ and the background strength (((average value of strength of 25.1 to 26.1°)+(average value of strength of 27.1 to) 28.1°)÷2) were measured.

Consequently, the peak strength appearing at $2\theta:26.64°$ was 10, and the peak strength ratio of the (011) plane of the quartz relative to the background strength, i.e. quartz peak strength/background strength, was 1.22.

These were both smaller compared to Example 8. The results are shown in Table 1. Here, the measuring device and conditions were the same as Example 1.

As a result of sputtering this target, the number of particles that were generated in a stationary state increased to 10.2. Moreover, the burn-in life of sputtering was 1.02 kWh, and the burn-in time increased. Thus, when the peak strength ratio of the (011) plane of the quartz decreased, the burn-in time of sputtering increased, and the number of particles that are generated during sputtering also increased. The results are shown in Table 1.

Example 9

In Example 9, as the raw material powders, Fe powder having an average grain size of 5 μm, Pt powder having an average grain size of 1 μm, $SiO_2$ powder (amorphous $SiO_2$ powder) having an average grain size of 1 μm, and C powder having an average grain size of 0.05 μm were prepared. These powders were weighed at the weight percentage of Fe powder 21.51 wt %, Pt powder 73.64 wt %, $SiO_2$ powder 4.75 wt %, and C powder 0.53 wt % to achieve a target composition of 43 Fe-43 Pt-9 $SiO_2$-5 C (mol %).

This mixed powder was filled in a carbon mold, and hot pressed in a vacuum atmosphere under the conditions of temperature of 1200° C., holding time of 120 minutes, and pressure of 30 MPa to obtain a sintered compact. This was further processed with a lathe to obtain a disk-shaped target having a diameter of 180 mm and thickness of 5 mm.

The peak strength of quartz was measured by cutting out a part of the target and performing measurement based on the X-ray diffraction method. The results are shown in Table 1. The peak strength appearing at 2θ:26.64° was 358, and the background strength (((average value of strength of 25.1 to 26.1°)+(average value of strength of 27.1 to) 28.1°)÷2) was also measured.

The peak strength ratio of the quartz of the (011) plane relative to the background strength, i.e. quartz peak strength/background strength, was 8.76. The measuring device was Ultima IV by Rigaku, and the conditions were as follows: tube voltage of 40 kv, tube current of 30 mA, scan speed of 4°/min, and step of 0.02°.

The results upon sputtering this target are shown in Table 1. The number of particles that were generated in a stationary state was 9.8. Upon measuring the number of particles in a stationary state, the deposition thickness was caused to roughly 20 times the film thickness of HDD products for a better view of the particles.

Moreover, the burn-in life of sputtering was 0.43 kWh. Thus, when the peak strength ratio of the quartz of the (011) plane is high, it was possible to shorten the burn-in time and reduce the number of particles that are generated.

Comparative Example 11

In Comparative Example 11, as the raw material powders, Fe powder having an average grain size of 5 μm, Pt powder having an average grain size of 1 μm, SiO$_2$ powder (amorphous SiO$_2$ powder) having an average grain size of 1 μm, and C powder having an average grain size of 0.05 μm were prepared. These powders were weighed at the weight percentage of Fe powder 21.51 wt %, Pt powder 73.64 wt %, SiO$_2$ powder 4.75 wt %, and C powder 0.53 wt % to achieve a target composition of 43 Fe-43 Pt-9 SiO$_2$-5 C (mol %).

Next, these powders were placed in a ball mill pot with a capacity of 10 liters together with zirconia balls as the grinding medium, and rotated and mixed for 20 hours.

Then, this mixed powder was filled in a carbon mold, and hot pressed in a vacuum atmosphere under the conditions of temperature of 1200° C., holding time of 120 minutes, and pressure of 30 MPa to obtain a sintered compact.

This was further processed with a lathe to obtain a disk-shaped target having a diameter of 180 mm and thickness of 5 mm. Note that, in the foregoing production process, the amorphous SiO$_2$ was formed into cristobalites. With the structure of this target, some SiO$_2$ subject to grain growth can be observed.

As with Example 1, the peak strength of the (011) plane of the quartz was measured by cutting out a part of the target and performing measurement based on the X-ray diffraction method. In other words, the peak strength appearing at 2θ:26.64° and the background strength (((average value of strength of 25.1 to 26.1°)+(average value of strength of 27.1 to) 28.1°)÷2) were measured.

Consequently, the peak strength appearing at 2θ:26.64° was 11, and the peak strength ratio of the (011) plane of the quartz relative to the background strength, i.e. quartz peak strength/background strength, was 1.23.

These were both smaller compared to Example 9. The results are shown in Table 1. Here, the measuring device and conditions were the same as Example 1.

As a result of sputtering this target, the number of particles that were generated in a stationary state increased to 31. Moreover, the burn-in life of sputtering was 2.062 kWh, and the burn-in time increased.

Thus, when the peak strength ratio of the (011) plane of the quartz decreased, the burn-in time of sputtering increased, and the number of particles that are generated during sputtering also increased. The results are shown in Table 1.

The sputtering target for a magnetic recording film target of the present invention yields superior effects of being able to inhibit the generation of micro cracks in a target, inhibit the generation of particles during sputtering, and shorten the burn-in time. Since few particles are generated, a significant effect is yielded in that the percent defective of the magnetic recording film is reduced and cost reduction can be realized. Moreover, shortening of the burn-in time contributes significantly to the improvement of production efficiency.

In addition, since the density of quartz is higher than the density of amorphous SiO$_2$ or cristobalite, the amount of substance of SiO$_2$ per unit volume can be increased by using quartz; that is, by increasing the amount of substance of oxide (i.e. quartz) in the target, the present invention yields a significant effect of being able to magnetically and finely separate the single-domain particles after deposition, and improve recording density.

Accordingly, the present invention is effective as a ferromagnetic material sputtering target for use in forming a magnetic body thin film of a magnetic recording medium, and particularly for forming a hard disk drive recording layer.

The invention claimed is:

1. A sputtering target for a magnetic recording film containing SiO$_2$, wherein a peak strength ratio of a (011) plane of quartz relative to a background strength in an X-ray diffraction is 1.40 or more.

2. The sputtering target for a magnetic recording film according to claim 1, wherein the sputtering target for a magnetic recording film contains Cr in an amount of 20 mol % or less (excluding 0 mol %), SiO$_2$ in an amount of 1 mol % or more and 20 mol % or less, and remainder being Co.

3. The sputtering target for a magnetic recording film according to claim 1, wherein the sputtering target for a magnetic recording film contains Cr in an amount of 20 mol % or less (excluding 0 mol %), Pt in an amount of 1 mol % or more and 30 mol % or less, SiO$_2$ in an amount of 1 mol % or more and 20 mol % or less, and remainder being Co.

4. The sputtering target for a magnetic recording film according to claim 1, wherein the sputtering target for a magnetic recording film contains Pt in an amount of 5 mol % or more and 60 mol % or less, SiO$_2$ in an amount of 20 mol % or less, and remainder being Fe.

5. The sputtering target for a magnetic recording film according to claim 1, wherein the sputtering target for a magnetic recording film contains Pt in an amount of 5 mol % or more and 60 mol % or less, SiO$_2$ in an amount of 20 mol % or less, and remainder being Co.

6. The sputtering target for a magnetic recording film according to claim 5, additionally containing, as an additive element, one or more elements selected from B, Ti, V, Mn, Zr, Nb, Ru, Mo, Ta, and W in an amount of 0.5 mol % or more and 10 mol % or less.

7. The sputtering target for a magnetic recording film according to claim 5, additionally containing, as an additive material, an inorganic material of one or more components selected from carbon, oxide excluding SiO$_2$, nitride, and carbide.

8. The sputtering target according to claim 4, containing an additive element selected from the group consisting of B, Ti, V, Mn, Zr, Nb, Ru, Mo, Ta, and W in an amount of 0.5 to 10 mol %.

9. The sputtering target according to claim 4, containing an additive inorganic material selected from the group consisting of carbon, oxide excluding $SiO_2$, nitride, and carbide.

10. The sputtering target according to claim 3, containing an additive element selected from the group consisting of B, Ti, V, Mn, Zr, Nb, Ru, Mo, Ta, and W in an amount of 0.5 to 10 mol %.

11. The sputtering target according to claim 3, containing an additive inorganic material selected from the group consisting of carbon, oxide excluding $SiO_2$, nitride, and carbide.

12. The sputtering target according to claim 2, containing an additive element selected from the group consisting of B, Ti, V, Mn, Zr, Nb, Ru, Mo, Ta, and W in an amount of 0.5 to 10 mol %.

13. The sputtering target according to claim 2, containing an additive inorganic material selected from the group consisting of carbon, oxide excluding $SiO_2$, nitride, and carbide.

14. The sputtering target according to claim 1, containing an additive element selected from the group consisting of B, Ti, V, Mn, Zr, Nb, Ru, Mo, Ta, and W in an amount of 0.5 to 10 mol %.

15. The sputtering target according to claim 1, containing an additive inorganic material selected from the group consisting of carbon, oxide excluding $SiO_2$, nitride, and carbide.

16. A method of producing a sputtering target for a magnetic recording film, comprising the steps of using quartz as a powder raw material of $SiO_2$, mixing the quartz powder raw material and magnetic metal powder raw material to form a powder mixture, and sintering the powder mixture at a temperature of 1300° C. or less to produce a sputtering target having a peak strength ratio of a (011) plane of quartz relative to a background strength in X-ray diffraction of 1.40 or more.

17. The method according to claim 16, wherein the sputtering target contains Cr in an amount that is greater than 0 mol % and equal to or less than 20 mol %, $SiO_2$ in an amount of 1 to 20 mol %, and Co.

18. The method according to claim 16, wherein the sputtering target contains Cr in an amount that is greater than 0 mol % and equal to or less than 20 mol %, Pt in an amount of 1 to 30 mol %, $SiO_2$ in an amount of 1 to 20 mol %, and Co.

19. The method according to claim 16, wherein the sputtering target contains Pt in an amount of 5 to 60 mol %, $SiO_2$ in an amount of 20 mol % or less, and Fe.

20. The method according to claim 16, wherein the sputtering target contains Pt in an amount of 5 to 60 mol %, $SiO_2$ in an amount of 20 mol % or less, and Co.

\* \* \* \* \*